July 8, 1969 F. D. WALDHAUER 3,454,888

TRANSISTORIZED POWER AMPLIFIER USING TWO SERIES CONNECTED TRANSISTORS DRIVEN BY AN EMITTER-COUPLED PAIR OF TRANSISTORS

Filed Aug. 23, 1967

INVENTOR
F. D. WALDHAUER
BY [signature]
ATTORNEY

United States Patent Office 3,454,888
Patented July 8, 1969

3,454,888
TRANSISTORIZED POWER AMPLIFIER USING TWO SERIES CONNECTED TRANSISTORS DRIVEN BY AN EMITTER-COUPLED PAIR OF TRANSISTORS

Frederick D. Waldhauer, Fair Haven, N.J., assignor to Bell Telephone Laboratories, Incorporated, Murray Hill, N.J., a corporation of New York Filed Aug. 23, 1967, Ser. No. 662,658
Int. Cl. H03f *3/04*
U.S. Cl. 330—15 1 Claim

ABSTRACT OF THE DISCLOSURE

A power amplifier using two series connected transistors driven by the output signal from an emitter-coupled pair of transistors with all the transistors of like conductivity type and feedback provided from the output of the circuit to the emitter-coupled pair to insure that the series connected pair of transistors are driven by equal out-of-phase signal currents.

*Summary of the invention*

Transistorized broadband power amplifiers for use in the frequency range of up to 300 mHz. are generally operated as Class A amplifiers because the characteristics of the transistors degrade at low current or voltages. Since Class A operation is used the power amplifiers are relatively inefficient. Efficiency may be improved by the use of circuits employing complementary type transistors, but such circuits are difficult to realize in practice because they require matching of characteristics of opposite conductivity type transistors which is particularly difficult at high frequencies.

It is an object of this invention to eliminate necessity for matching the charatceristics of opposite conductivity type transistors in order to obtain an efficient transistorized broadband amplifier.

In accordance with this invention, two series connected transistors are driven by equal output currents derived from an emitter-coupled pair of transistors. All of the transistors are of the same conductivity type and a circuit interconnecting the output of the two series connected transistors and the emitter-coupled pair insures that the series connected pair are driven by equal out-of-phase currents.

This invention will be more fully comprehended from the following detailed description taken in conjunction with the drawings in which:

*Detailed description*

Figure 1:
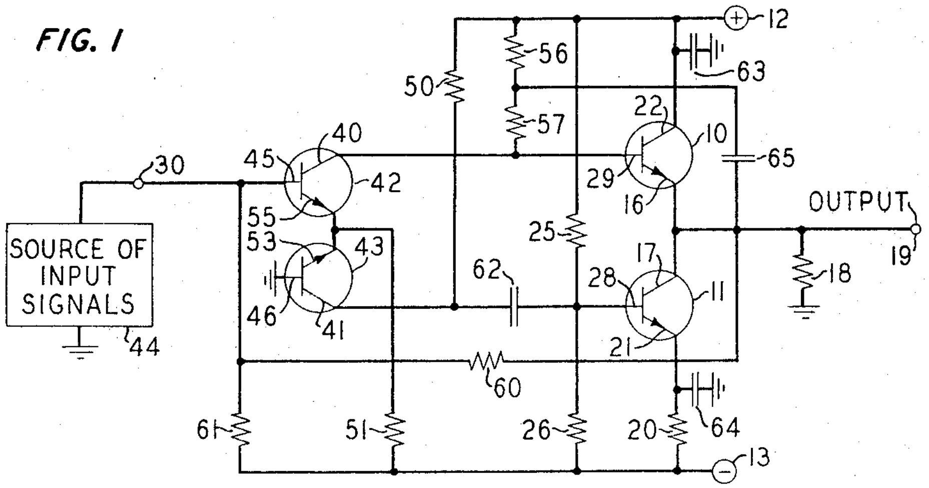
FIG. 1 is a first power amplifier embodying this invention.

Two n-p-n power transistors 10 and 11 have their emitter-collector circuits connected between a source of positive voltage 12 and a source of negative voltage 13, with the emitter electrode 16 and collector electrode 17 of transistors 10 and 11, respectively, connected together. The junction of emitter electrode 16 and collector electrode 17 is connected to load resistor 18 connected between the output terminal 19 and ground. The collector electrode 22 of transistor 10 is directly connected to source 12 with the operating current for transistors 10 and 11 established by resistor 20 connected between source 13 of negative voltage and the emitter electrode

21 of transistor 11. The emitter potential of transistor 11 is established by the driver circuit comprising resistors 26 and 26 connected between sources 12 and 13 with the common junction of the resistors connected to the base electrode 28 and transistor 11.

In accordance with this invention, the base electrodes 29, 28 of transistors 10 and 11 are driven by equal out-of-phase currents obtained from the collector electrodes 40 and 41 of emitter-coupled pairs of transistors 42 and 43 respectively. The input signal from source 44 is applied, in this first embodiment of the invention, between the base electrode 45 of transistor 42, and ground with the base electrode 46 of transistor 43 grounded. Resistors 50 and 51 connecting collector electrode 41 and emitter electrode 53, respectively, to surces 12 and 13 serve to properly bias transistor 43. Since emitter electrode 55 of transistor 42 is connected to emitter electrode 53 of transistor 43, resistors 56 and 57 connecting source 12 to collector electrode 40 complete the bias circuitry for transistor 42. Feedback from output terminal 19 to the input terminal 30 is provided by resistor 60 whose value determines the gain of the amplifier. A resistor 61 connected between input terminal 30 and source 13 serves to establish the collector electrode 17 voltage of transistor 11. To prevent the direct current voltage at the collector electrode 41 of transistor 43 from being applied to the base electrode 28 of transistor 11, a blocking capacitor 62 is employed. Bypass capacitors 63 and 64 connect the collector electrode 22 of transistor 10 and the emitter electrode 21 of transistor 11 to ground.

Wtihout additional circuitry, the AC signal current through resistors 56 and 57 obtained at collector electrode 40 would be larger than that through the parallel combination of resistors 50, 25 and 26 connected to collector electrode 41. This is because the collector 40 voltage of transistor 42, which includes the output voltage at terminal 19, is greater than the collector electrode 41 voltage which does not include the output voltage. As a result, the currents applied to the base electrodes 29 and 28 of transistors 10 and 11, respectively, would not be equal. electrode 28 of transistor 11, a blocking capacitor 62 is nects the junctions of resistors 56 and 57 to the output terminal. As a result, there is a substantial reduction in the voltage across resistor 57 reducing the current therein and making the base input current to transistor 10 equal to the base input current to transistor 11.

Figure 2:
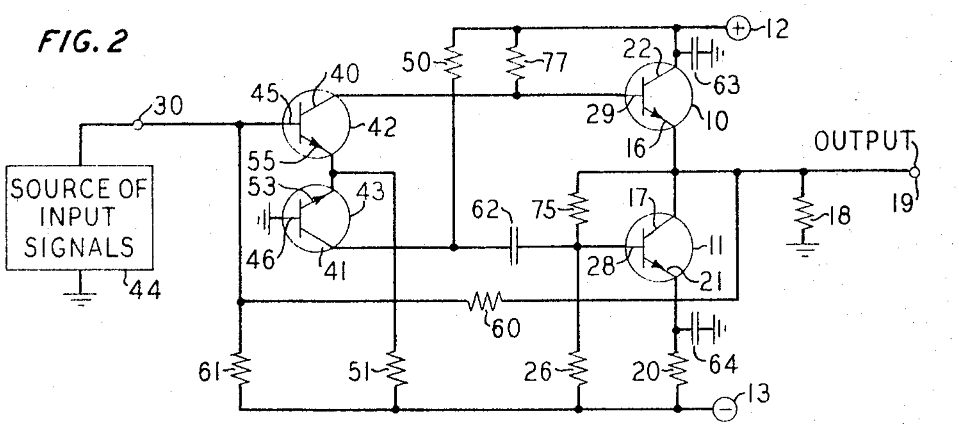
FIG. 2 is a second power amplifier embodying this invention.

Another alternative for insuring that the base input currents to transistors 10 and 11 are equal is to employ a feedback resistor between the output terminal 19 and the base electrode 28 of transistor 11 as in the embodiment shown in FIG. 2. This resistor 75 feeds back a signal current from the output terminal 19 through the collector emitter circuit of transistor 43, to the collector electrode circuit of transistor 42. This current, in addition to the small current through resistor 50 is approximately equal to the load current of resistor 77. As a result, the signal currents applied to the base electrodes 28 and 29 are equal. Since the capacitor 65 shown in FIG. 1 is not employed, resistors 56 and 57 may be combined into a single resistor 77 connected between the collector electrode 40 of transistor 42 and source 12. In all other respects the circuitry shown in FIG. 1 and like components have been given the same reference numerals.

Figure 3:
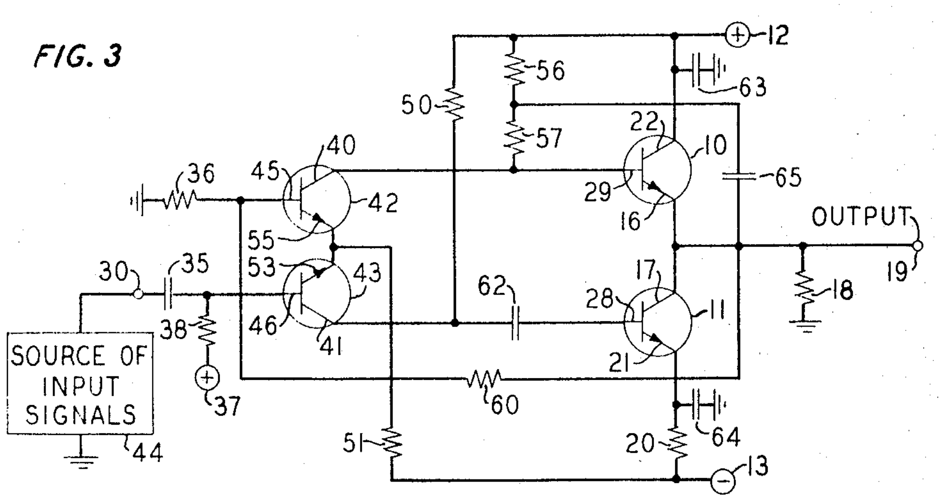
FIG. 3 is a third power amplifier embodying this invention.

A third embodiment of this invention, providing better phase balance and a more constant input impedance with respect to frequency is shown in FIG. 3. This circuit is identical to that of FIG. 1 with the following exceptions: First, the input signal is applied to the base electrode 46 of transistor 43 through an input DC blocking capacitor 35, and the base electrode 45 of transistor 42 is connected to ground through a resistor 36. Second, a direct current bias voltage is applied to the base electrode 46 of transistor 43 by means of a source of positive voltage 37 connected to the base electrode 46 by means of resistor 38.

The advantage of the circuit shown in FIG. 3 compared to that of FIG. 1 is that the phase delay of the upper signal path of the circuit comprising transistors 43, 42 and 10 is very nearly equal to the phase delay of the lower half of the signal path of the circuit which path comprises transistors 43 and 11. In the embodiment of the invention shown in FIG. 1, the upper signal path consists of transistor 42 in the common emitter configuration followed by transistor 10 in the common collector configuration. The lower signal path for the input signal comprises transistor 42 in the common collector configuration, transistor 43 in the common base configuration and transistor 11 in the common emitter configuration. The signal delay in the lower path of the circuit shown in FIG. 1 is longer than that in the upper path so that high frequency signals tend to be out-of-phase at the output.

By applying the input signal to the base electrode of transistor 43 as shown in FIG. 3, the upper signal path now comprises three transistors 43, 42 and 10 in the common collector, common base and common collector configurations, respectively, and the lower path comprises two transistors both in the common emitter configuration. Since common emitter stages have a longer inherent delay than either the common base or common collector configuration, the delay of the two common emitter stages in the lower path are approximately equal to the total delay introduced by the three transistors in the upper path. In addition, the input impedance has been found to be more constant with respect to frequency.

Thus, in accordance with this invention, two series connected transistors are driven by equal out-of-phase signals derived from an emitter-coupled pair of transistors with all of the transistors of like conductivity type, eliminating the necessity for matching complementary type transistors while at the same time providing a relatively efficient power amplifier.

It is to be understood that the above described arrangements are merely illustrative of the principles of the invention. Numerous other arrangements may be devised by those skilled in the art without departing from the spirit and scope of the invention.

What is claimed is:

1. An amplifier circuit comprising in combination, four transistors of like conductivity type each having base, emitter, and collector electrodes, a source of collector emitter bias voltage, means connecting the emitter electrode of a first of said transistors and the collector electrode of a second of said transistors to an output terminal, means connecting the collector electrode of said first transistor and the emitter electrode of said second transistor across said source of bias voltage, a direct connection between the emitter electrodes of said third and fourth transistors so that they operate as an emitter-coupled pair, means connecting the collector electrode of said third transistor to the base electrode of said first transistor, means connecting the collector electrode of said fourth transistor to the base electrode of said second transistor, means connecting the collector and emitter electrodes of said third and fourth transistors to said source of bias voltage, a source of input signals, means connecting said third and fourth transistors to said source to receive said input signals so that said third and fourth transistors amplify said input signals, and a feedback resistor connected between said output terminal and said base electrode of said second transistor to insure that the input currents to the base electrodes of said first and second transistors are equal and out of phase.

References Cited

UNITED STATES PATENTS

| | | | |
|---|---|---|---|
| 2,761,019 | 8/1956 | Hall | 330—70 X |
| 2,763,733 | 9/1956 | Coulter | 330—70 XR |
| 2,929,026 | 3/1960 | Walker | 330—70 X |
| 3,376,515 | 4/1968 | Dilley | 330—15 |

JOHN KOMINSKI, *Primary Examiner.*

J. B. MULLINS, *Assistant Examiner.*

U.S. Cl. X.R.

330—18, 28